United States Patent
Torrisi et al.

(10) Patent No.: US 6,784,721 B2
(45) Date of Patent: Aug. 31, 2004

(54) DRIVER CIRCUIT FOR SOFT TURNING ON A POWER ELEMENT CONNECTED TO AN INDUCTIVE LOAD

(75) Inventors: Giovanni Luca Torrisi, Catania (IT); Antonino Torres, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 291 days.

(21) Appl. No.: 10/050,595

(22) Filed: Jan. 15, 2002

(65) Prior Publication Data

US 2002/0109417 A1 Aug. 15, 2002

(30) Foreign Application Priority Data

Jan. 17, 2001 (IT) .................................... MI2001A0075

(51) Int. Cl.[7] .......................................... H03K 17/687
(52) U.S. Cl. ...................................... 327/434; 323/271
(58) Field of Search ................................ 327/374–377, 327/389, 427, 430–435, 437, 440, 110; 323/238, 271

(56) References Cited

U.S. PATENT DOCUMENTS

| | | | | |
|---|---|---|---|---|
| 5,917,254 A | * | 6/1999 | Lecce et al. ................ 307/125 |
| 6,111,453 A | * | 8/2000 | Uchida et al. .............. 327/384 |
| 6,219,262 B1 | * | 4/2001 | Burgyan ...................... 363/97 |
| 6,483,280 B2 | * | 11/2002 | La Barbera et al. ........ 323/271 |

* cited by examiner

*Primary Examiner*—My-Trang Nu Ton
(74) *Attorney, Agent, or Firm*—Lisa K. Jorgenson; Allen, Dyer, Doppelt, Milbrath & Gilchrist, P.A.

(57) ABSTRACT

A driver circuit drives a power element connected to an inductive load. The driver circuit includes an output terminal, and a first current generator is connected between a voltage reference and the output terminal for providing a first charge current to a control terminal of the power element, which is connected to the output terminal. The driver circuit also includes a second current generator connected in parallel with the first current generator. The second current generator is connected between the voltage reference and the output terminal, and provides the control terminal with a second charge current dependent on a voltage present at the input terminal. The input terminal is connected to a conduction terminal of the power element.

37 Claims, 7 Drawing Sheets

DRIVER CIRCUIT FOR SOFT TURNING ON A POWER ELEMENT CONNECTED TO AN INDUCTIVE LOAD

FIELD OF THE INVENTION

The present invention relates to a driver circuit for soft turn-on of a power element connected to an inductive load. The invention relates more particularly, but not exclusively, to a driver circuit for soft turn-on of an IGBT power transistor connected in an electronic ignition system for automotive applications.

BACKGROUND OF THE INVENTION

Inductive loads for coils are associated with a power element for driving them, and in particular, for turning them on/off. A driver circuit is, therefore, associated with the power element. In an automotive electronic ignition system, an IGBT power transistor is connected to a spark plug, for example.

FIG. 1 shows schematically a final stage 1 of a conventional electronic ignition system. In particular, the final stage 1 is connected between a first supply voltage reference, e.g., a battery VB, and a second voltage reference, e.g., ground GND. The final stage 1 comprises an electronic switch 2 connected between an inductance L1 of the primary windings of a coil 3 that has a corresponding inductance L2 of the secondary windings connected to an output terminal OUT1 of the final stage 1. A load 4, e.g., a spark plug in automotive applications, is connected to the output terminal OUT1 of the final stage 1.

The electronic switch 2 is also connected to an input terminal IN1 of the final stage 1. By providing a logic input signal Vin1 at a logic high to the input terminal IN1, the electronic switch 2 enables a charge current Iloadl to flow through so that energy is stored in the primary winding inductance L1. In a complementary way, when the logic input signal Vin goes low, the electronic switch 2 opens to generate an overvoltage value Vc1 to a terminal of the primary winding inductance L1.

This overvoltage Vc1 generates a trigger voltage Vsec1 across the secondary winding inductance L2, dependent on the turn ratio of the primary and secondary windings in the coil 3. In the exemplary load under consideration, the ratio of turns of the coil 3 is selected to generate a trigger voltage Vsec1 of thousands of volts, so that a spark can be generated across the spark plug gap over the output terminal OUT1.

Shown schematically in FIG. 2 are typical waveforms of a load turn-on in a conventional electronic ignition system whose final stage comprises an electronic switch of the kind described in relation to FIG. 1. In such electronic ignition systems, an error condition may be entered as a consequence of an undesirable trigger voltage overshoot dVsec1/dt across the secondary winding inductance L2. For example, during a turn-on phase of the electronic ignition system that comprises the final stage 1 and spark plug 4, a voltage variation dVc1/dt across the primary winding inductance L1 may produce a sufficient voltage variation dVsec1/dt across the secondary winding inductance L2 to generate a spark at the spark plug 4.

FIG. 3 shows schematically a waveform related to a conventional turn-on procedure in a conventional electronic ignition system employing an IGBT transistor 2 for an electronic switch. It is known that, upon the occurrence of a negative voltage variation dVc1/dt, the trigger voltage Vsec1 may attain a high value of 1,000 Volts, which would result in a spark being generated at the spark plug 4.

For this reason, many specifications regarding automotive applications set a maximum of 500 to 600 Volts for the trigger voltage Vsec1 to the secondary winding inductance L2 during those phases when no spark is required. It has been known to use for this purpose a soft turn-on procedure for the electronic switch 2, coincidently with turning on the electronic ignition system that contains the switch. This is done to minimize the effects of a first negative variation dVc/dt of the voltage to the primary winding inductance L1, and of the consequent overshoot dVsec1/dt of the trigger voltage Vsec1 to the secondary winding inductance L2. In particular, for a softer turn-on of the power device in the electronic switch 2, a capacitor is connected between a collector terminal of the power device and its control terminal.

This first prior art approach requires that a high voltage element (HW) be provided external the ignition system. This approach reflects on the overall cost of the system. It also has a major disadvantage in that the power device turn-off is slowed during the phase of generating a spark to the load, resulting in wasted energy from the primary winding inductance L1 to the secondary winding inductance L2.

Shown schematically in FIG. 4 are waveforms of internal signals of an IGBT transistor that is driven with a constant gate current Ig. Upon a gate voltage Vg of the IGBT transistor reaching a threshold voltage value Vth of the transistor, the transistor becomes conductive. This allows a collector current Ic to go through and the load device to be turned on. During this phase, the IGBT transistor will increase the initial slope of the gate voltage Vg by the Miller effect.

As is well known, this Miller effect is due to the voltage evolution at a collector terminal of the IGBT transistor, and disappears as the negative variation dVc/dt of the collector voltage passes away. In other words, the IGBT transistor exhibits a large equivalent capacitance due to the Miller effect, in parallel with its intrinsic gate-source capacitance Cgs.

A single way of influencing the turn-on phase of the IGBT transistor is that of driving its gate terminal with a very small gate current Ig, so as to further extend the duration of charge delivery to the total equivalent capacitance Cgs*, which is subject to the Miller effect, and change the slope of a collector terminal current Ic. This prior driving procedure is unrelated to the behavior of the electronic voltage reference, for example, a high voltage connected to the IGBT transistor, which would be a problem for circuitry that is powered from the gate terminal of the IGBT transistor.

A limited driver circuit, as shown generally at 5 in FIG. 5 in schematic form, may also be used. In particular, the limited driver circuit 5 is connected between a first voltage reference, such as a supply voltage VDD, and a second voltage reference, such as ground GND, and is connected to a gate terminal G6 and an emitter terminal E6 of an IGBT transistor 6.

The IGBT transistor 6 has a collector terminal C6 connected to a load device 9, which in turn is connected to the supply voltage reference VDD. The limited driver circuit 5 further comprises a generator 7 for generating a drive current Idriv, and is connected between the supply voltage reference VDD and the gate terminal G6 of the IGBT transistor 6. A limiter circuit 8 is connected between the gate terminal G6 and the emitter terminal E6 of the IGBT transistor 6. The emitter terminal E6 is connected to ground GND.

The drive current Idriv is thus separated as a first current portion (current Ilim) and a second current portion (Ig). The current Ilim is absorbed by the limiter circuit 8. The gate current Ig is for the gate terminal G6 of the IGBT transistor 6. The total equivalent capacitance Cgs* of the IGBT transistor 6 is, therefore, charged with a gate current Ig given as:

*Ig=Idriv−Ilim.*

To obtain a narrowly limited value of the gate current Ig, the currents Idriv and Ilim must have comparable values. This condition is, however, made critical by process temperature spreads in the ignition system that comprises the limited driver circuit 5, which can cause a current balance such that the load device 9 cannot be turned on.

SUMMARY OF THE INVENTION

In view of the foregoing background, an object of the present invention is to provide a driver circuit for soft turn-on of a power element to prevent the occurrence of voltage overshooting at a load connected to the power element, and thus overcome the shortcomings of the driver circuits of the prior art.

This and other objects, advantages and features of the present invention are provided by a pair of current generators for driving the power element, and generating different current values in parallel with each other. The driver circuit charges the gate capacitor with a small current only after the power element initiates a turn-on phase.

Based on this principle, the technical problem is addressed by a driver circuit comprising at least a second current generator connected, in parallel with a first current generator, between the voltage reference and the output terminal to provide the control terminal with a second charge current dependent on a voltage value present at the input terminal. The input terminal is connected to a conduction terminal of the power element.

BRIEF DESCRIPTION OF THE DRAWINGS

The features and advantages of the driver circuit according to this invention will be apparent from the following detailed description of an embodiment thereof, given by way of a non-limitative example with reference to the accompanying drawings.

In the drawings.

DETAILED DESCRIPTION OF THE PREFERRED EMBODIMENTS

Figure 1:
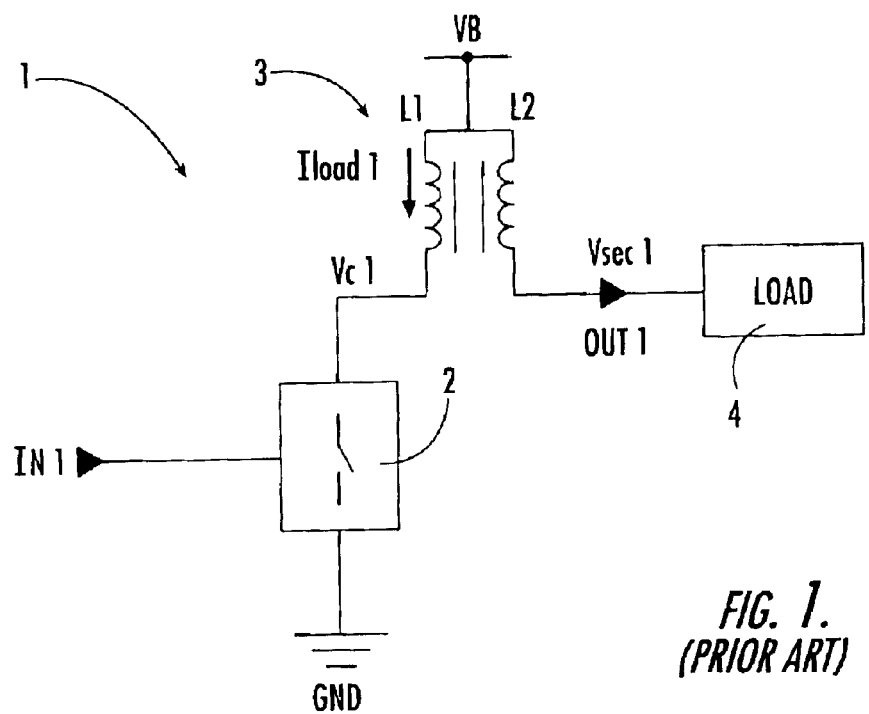
FIG. 1 shows schematically a driver circuit for driving a power element according to the prior art.
Figure 2:
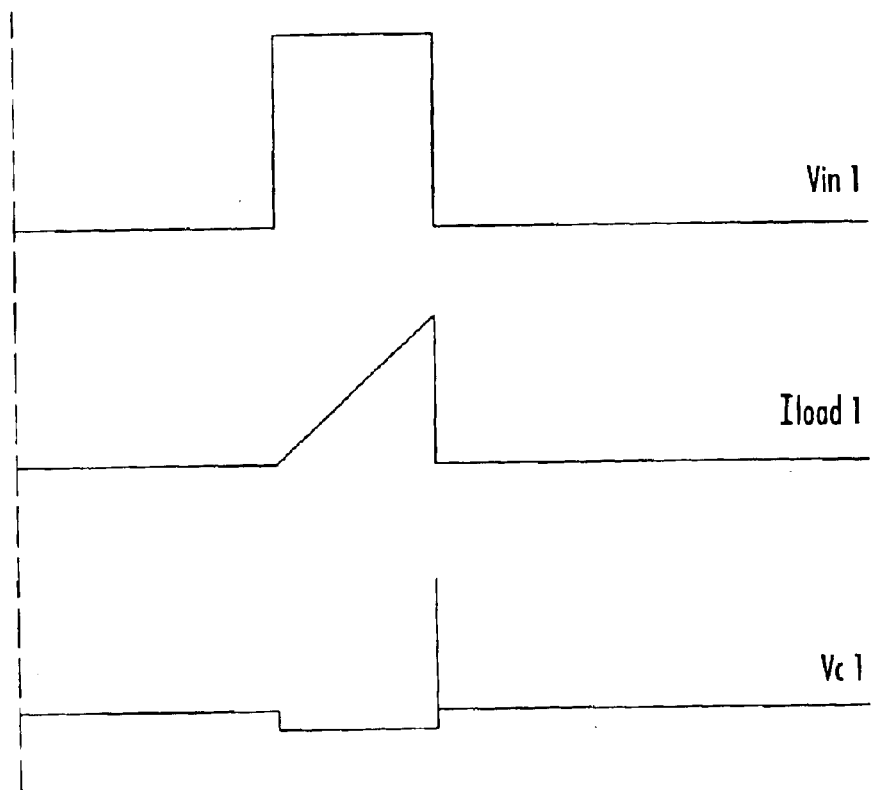
FIGS. 2, 3 and 4 show schematically internal signals versus time of the circuit illustrated in FIG. 1.
Figure 3:
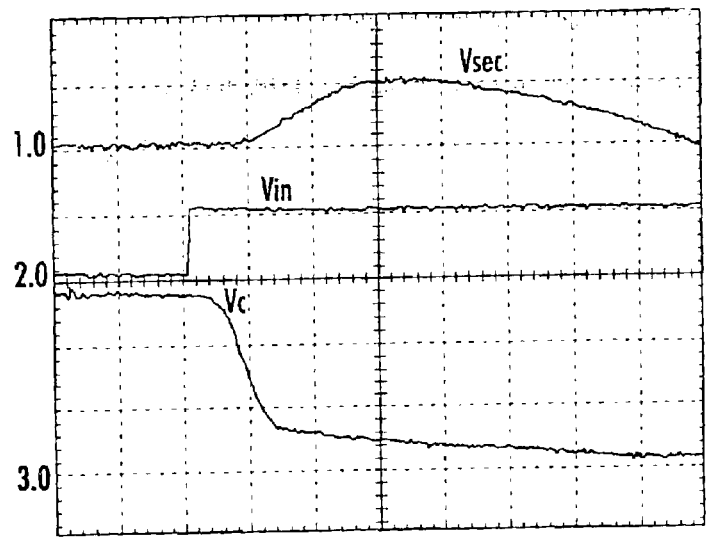
Figure 4:
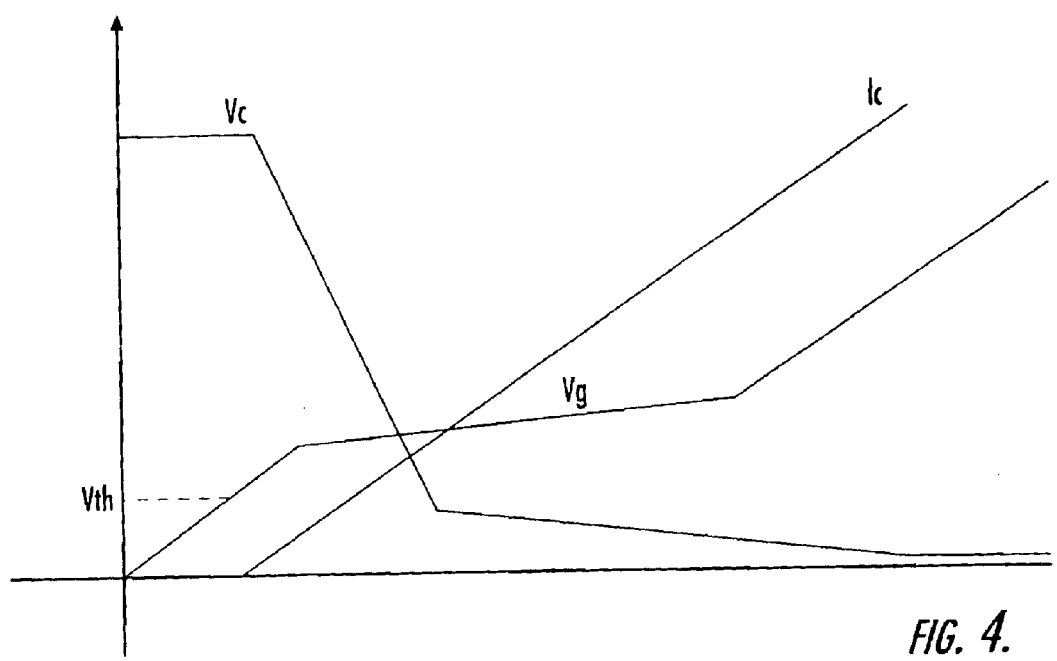
Figure 5:
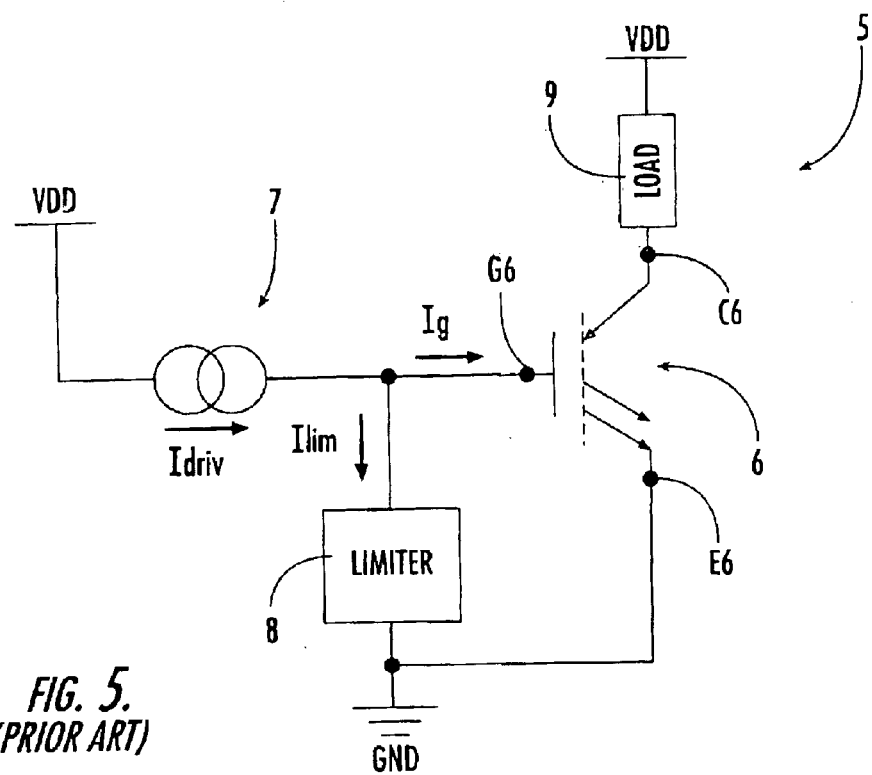
FIG. 5 shows schematically a variation of the circuit illustrated in FIG. 1.
Figure 6:
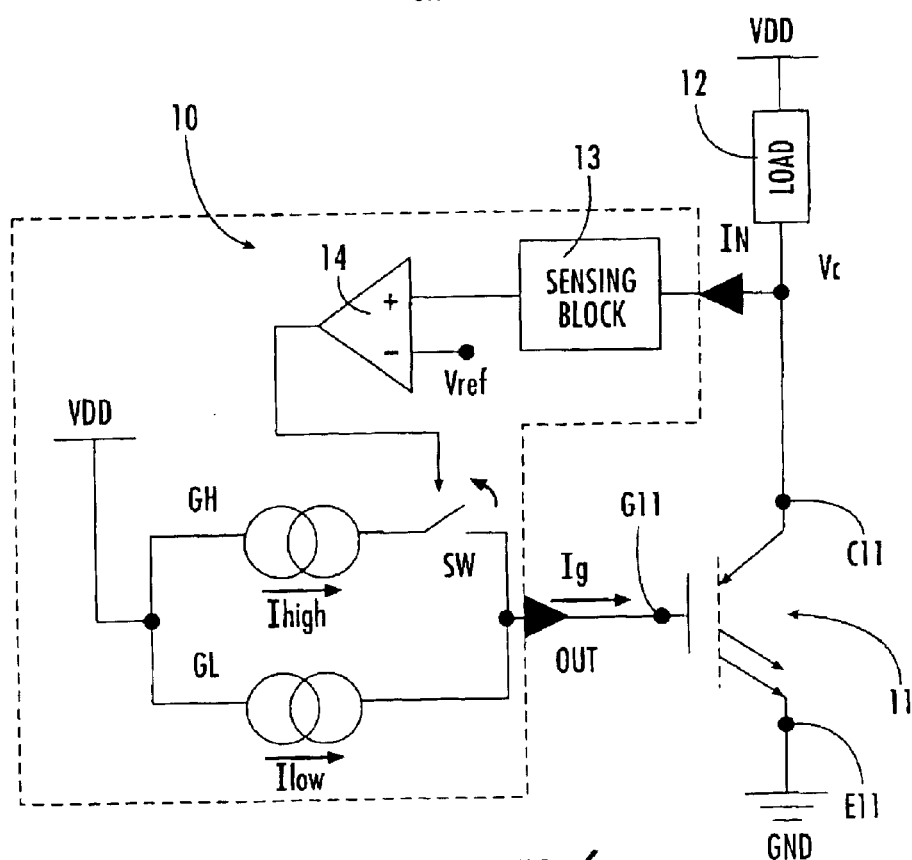
FIG. 6 shows schematically a driver circuit according to the invention.

With particular reference to FIG. 6 of the drawings, a driver circuit for soft turn-on of a power element, according to the present invention, is shown generally at 10 in schematic form. The driver circuit 10 has an input terminal IN connected to an interconnect point of a power element, in particular, an IGBT transistor 11, and a load device 12. The power element and the load device are connected together in series between a first voltage reference, e.g., a supply voltage VDD, and a second voltage reference, e.g., ground GND. The driver circuit 10 also has an output terminal OUT connected to a gate terminal G11 of the IGBT transistor 11. The latter has an emitter terminal E11 connected to ground GND and a collector terminal C11 connected to the load device 12.

Advantageously, the driver circuit 10 comprises a first generator GL for generating a first charge current Ilow, and a second generator GH for generating a second charge current Ihigh. These current generators are connected in parallel between the supply voltage reference VDD and the gate terminal G11 of the IGBT transistor 11. In particular, the second generator GH is connected to the gate terminal G11 of the IGBT transistor 11 through a switch SW.

The first and second generators GL and GH have different values, i.e., they generate different currents, and the value of the first charge current Ilow is smaller than that of the second charge current Ihigh. The driver circuit 10 further comprises voltage sense-and-compare means connected between the input terminal IN and a drive terminal of the switch SW.

In particular, this voltage sense-and-compare means comprises a sensing block 13, which is connected to the input terminal IN and to a first non-inverting (+) input terminal of a voltage comparator 14. The voltage comparator 14 has a second or inverting (−) input terminal connected to an internal voltage reference Vref. An output terminal of the voltage comparator 14 is connected to the drive terminal of the switch SW.

Advantageously, the sensing block 13 is operative to open, through the voltage comparator 14, the switch SW by disconnecting the second generator GH from the gate terminal G11 of the IGBT transistor 11 when a voltage Vc at the collector terminal C11 begins to decrease. In this way, the driver circuit 10 enables a phase of charging an equivalent gate capacitance Cgs of the IGBT transistor 11 with the first charge current Ilow, having a small value, from the first generator GL, only after the IGBT transistor 11 initiates a turn-on phase.

Thus, problems from failure to turn-on the power element because no current is supplied are avoided. In particular, the sensing block 13 derives the collector voltage Vc, and can be fabricated conventionally by various techniques, essentially dependent on the technology employed.

Figure 7:
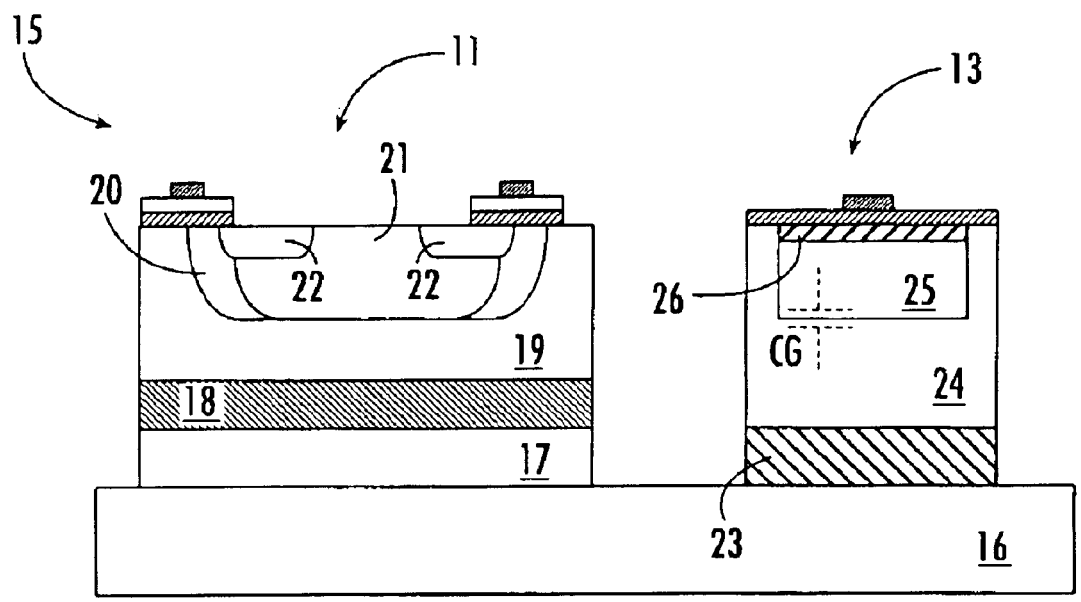
FIG. 7 shows schematically an integrated structure embodying the circuit illustrated in FIG. 6.

As shown schematically in FIG. 7, for example, when VIPower technology is used, the sensing block 13 is a junction capacitor CG of a high voltage PBL-EPI diode. This capacitor is electrically connected by a package frame to a substrate where the IGBT transistor 11 is formed.

In particular, FIG. 7 shows schematically an integrated circuit 15, which comprises a conductive layer 16 of the frame in which the IGBT transistor 11 and sensing block 13 are formed. The IGBT transistor 11 comprises a substrate 17 having a first, e.g., a P-type conductivity and which is very heavily doped (P++). The substrate is overlaid by an intermediate layer 18 having a second, e.g., an N-type conductivity and which is heavily doped (N+), and by an epitaxial layer 19 having the second type of conductivity and which is lightly doped (N−).

Areas corresponding to the active areas of the IGBT transistor 11 are formed in the epitaxial layer 19 as follows: a first well 20 having the first type of conductivity and being lightly doped (P−), a second or body well 21 also having the first type of conductivity and being heavily doped (P+), and suitable areas 22 having the second type of conductivity and being heavily doped (N+).

The sensing block 13 comprises a substrate having the second type of conductivity and is heavily doped (N+), and the substrate is overlaid by an epitaxial layer 24 having the second type of conductivity and is lightly doped (N−). A well 25 with conductivity of the first type (P), having a heavily doped (P+) surface layer 26, is then formed in the epitaxial layer 24. The epitaxial layer 24 and the well 25 jointly form the junction capacitor CG.

Figure 8:
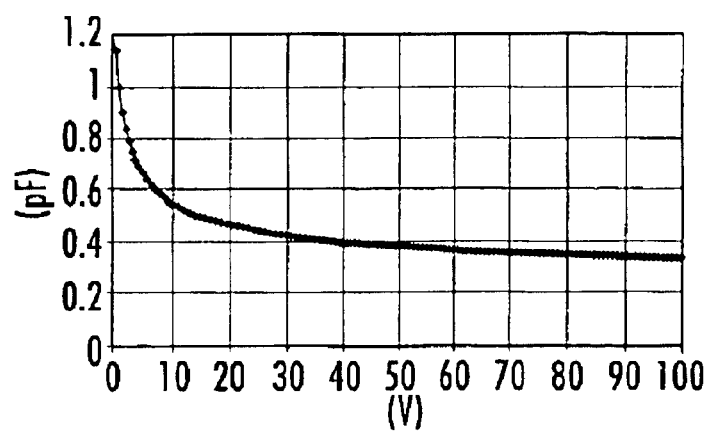
FIG. 8 illustrates schematically a capacitance/voltage characteristic of one element of the integrated structures illustrated in FIG. 7.

The capacitance of the junction capacitor CG depends on the value of the voltage applied to the integrated circuit 15, which becomes negligible at voltages above a few tens of volts, as shown schematically in FIG. 8. This ensures that the driver circuit 10, which comprises a sensing block provided by the integrated structure 13 of FIG. 7 (i.e., a high voltage capacitor), will not, when the collector terminal C11 is applied as a high voltage, interfere with the performance of the ignition system that contains it during the phase of triggering on an ignition spark at the load. Alternatively, the sensing block 13 may be provided in a power section of the integrated circuit by utilizing a parasitic capacitor, which would be connected structurally to a high-voltage terminal and be present in the power element employed (whether a power MOS transistor or an IGBT transistor).

Figure 9:
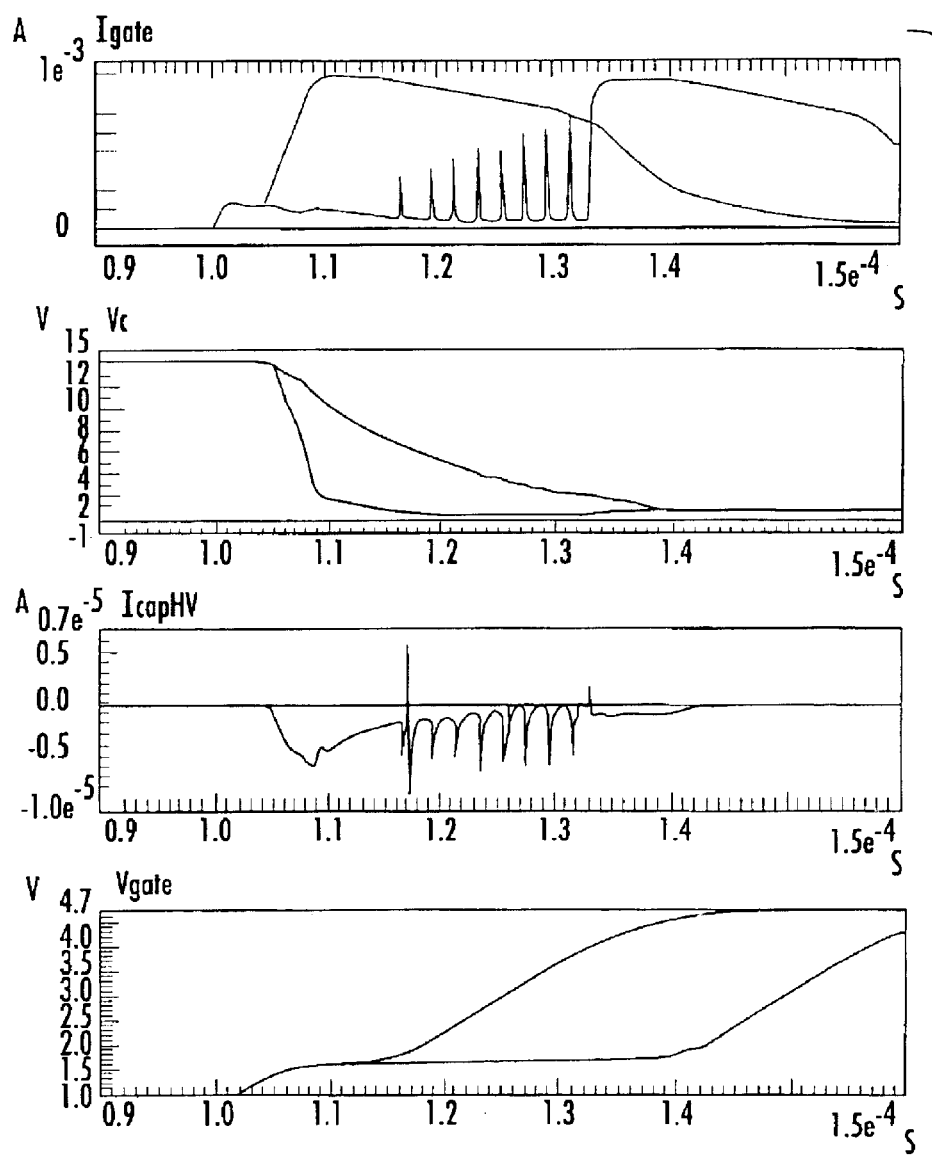
FIG. 9 shows schematically internal signals versus time of the circuit illustrated in FIG. 6.

The waveforms of FIG. 9 illustrate operation of the driver circuit 10 according to the invention. It can be seen that the junction capacitor CG of the sensing block 13 will, when a voltage derivative dVc/Dt is sensed on the collector terminal C11 of the IGBT transistor 11, input a current peak to the voltage comparator 14 and turn-off the second generator GH through the comparator 14 and switch SW. The small value of the first charge current Ilow from the first generator GL extends the charging time of the gate terminal G11. This forces the IGBT transistor 11 to generate a negative derivative dVc/dt of the voltage Vc at the collector terminal C11 which is considerably steeper than in the driver circuits described in connection with the prior art.

Once the current peak from the junction capacitor CG finishes, the gate terminal G11 is charged with the sum of the charge currents Ilow and Ihigh from the parallel connected generators GL and GH. When the voltage Vc at the collector terminal C11 approaches its minimum, the equivalent capacitor Cgs of the IGBT transistor 11 keeps charging at a maximum current value Imax given as:

$$Imax=Ilow+Ihigh.$$

If the transition on the collector terminal C11 is not completed yet, the driver circuit 10 first enables the second generator GH to generate the second charge current Ihigh, and then senses a fresh voltage derivative dV/dt and again turns off the second generator GH. Thus, the driver circuit 10 creates a feedback between the collector terminal C11 and the gate terminal G11 of the IGBT transistor 11, which can adjust the balance of currents in the equivalent capacitor Cgs.

Furthermore, the IGBT transistor 11 will conduct even when the value of the first charge current I low is too small with respect to the drainage from the gate terminal G11. Advantageously, the equivalent capacitor Cgs (typically a few nF) integrates current peaks of different values, thereby preventing the ripples on the current to the load device 12.

Moreover, the driver circuit 10 has no need of a battery pin, and accordingly, can be applied to 3-pin devices as well. Another advantage of the driver circuit 10 is that it is fully integratable.

A preferred embodiment of the driver circuit 10 according to the invention, as applied to an electronic ignition system for automobiles, will now be discussed with specific reference to FIG. 10. In particular, the driver circuit 10 of FIG. 10 includes a sensing block 13 that is formed by a HV junction diode D11 having a capacitance C1. This diode is connected between the input terminal IN of the driver circuit 10 and the non-inverting input terminal I14+ of the voltage comparator 14.

Figure 10:
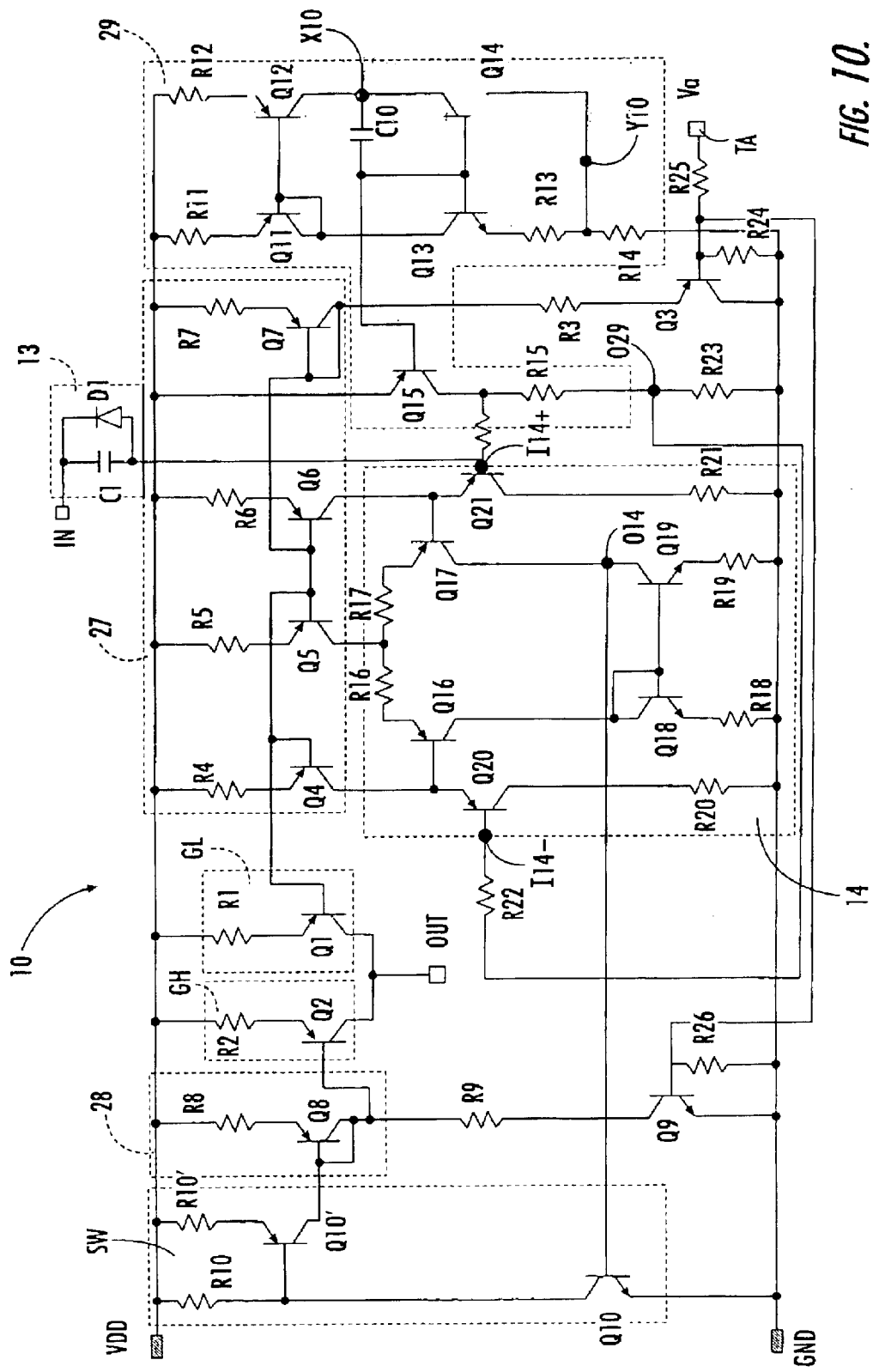
FIG. 10 is a more detailed view of the circuit illustrated in FIG. 6.

Further in the embodiment shown in FIG. 10, the first generator GL comprises a first transistor Q1, which has a first conduction terminal connected to the supply voltage reference VDD through a first resistor R1, and a second conduction terminal connected to the output terminal OUT of the driver circuit 10. The transistor also includes a control terminal connected through a first mirroring block 27, and an enable transistor Q3 to an enable terminal TA adapted to receive a driver circuit enable signal Va.

The first mirroring block 27 comprises a plurality of cascaded mirror transistors (Q4, Q5, Q6, Q7) connected to the supply voltage reference VDD through a plurality of resistors (R4, R5, R6, R7). In particular, the first transistor Q1 generates the first charge current Ilow and mirrors the transistor Q7 within the first mirroring block 27. This transistor Q1 is enabled by the enable transistor Q3 on the occurrence of an enable signal Va on the enable terminal TA, and provides the first charge current Ilow to the output terminal OUT. The output terminal OUT is connected to the control terminal of the IGBT transistor.

Likewise, the second generator GH comprises a second transistor Q2, which has a first conduction terminal connected to the supply voltage reference VDD through a second resistor R2, and a second conduction terminal connected to the output terminal OUT of the driver circuit 10. The transistor also includes a control terminal connected, through a series of a second mirroring block 28 and an enable transistor Q9, to the enable terminal TA.

The second mirroring block 28 comprises a diode-configured transistor Q8 connected to the supply voltage reference VDD through a resistor R8, and connected to the control terminal of the second transistor Q2. In particular, the second transistor Q2 is to generate the second charge current Ihigh and mirror the transistor Q8 within the second mirroring block 28. This transistor Q2 is enabled by the enable transistor Q9 on the occurrence of an enable signal Va on the enable terminal TA, and provides the second charge current Ihigh to the output terminal OUT.

The driver circuit 10 of FIG. 10 includes a switch SW comprised of a first transistor Q10, having a first conduction terminal connected to the supply voltage reference VDD through a first resistor R10, a second conduction terminal connected to ground GND, and a control terminal connected to the output terminal Q14 of the voltage comparator 14. The switch SW further comprises a second transistor Q10', having a first conduction terminal connected to the supply voltage reference VDD through a second resistor R10', a control terminal connected to the first conduction terminal of the first transistor Q10, and a second conduction terminal connected to the control terminal of transistor Q8 within the second mirroring block 28.

The driver circuit 10 also comprises an internal generator 29 for generating the reference voltage Vref, which is connected between the supply voltage reference VDD and ground GND, and comprises a current mirror formed of first Q11 and second Q12 mirror transistors, respectively connected to the supply voltage reference VDD through first R11 and second R12 resistors. In particular, the second mirror transistor Q12 has a control terminal connected to a control terminal of the first, diode-configured mirror transistor Q11.

The internal generator 29 further comprises third and fourth transistors, Q13 and Q14, which are connected respectively between the first Q11 and second Q12 mirror transistors and an internal node Y10. In particular, the third transistor Q13 is connected to the internal node Y10 through a third resistor R13, which in turn is connected to ground GND through a fourth resistor R14.

Furthermore, the third and fourth transistors Q13 and Q14 have their control terminals connected together and to a node X10 provided intermediate between the second and fourth transistors Q12 and Q14 through a capacitor C10, and connected to a control terminal of a fifth or output transistor Q15. This transistor is connected to the supply voltage reference VDD and to an output terminal O29 of the internal generator 29 through a fifth resistor R15. The internal generator 29 shown in FIG. 10 generates a stable signal on the node X10 for supplying to the fifth transistor Q15 and for providing the reference voltage Vref on the output terminal O29.

In the embodiment shown in FIG. 10, the voltage comparator 14 comprises a plurality of transistors (first Q16 and second Q17 input transistors, first Q18 and second Q19 output transistors, and first Q20 and second Q21 trigger transistors) and respective resistors (R16, R17, R18, R19, R20, R21) in a conventional arrangement to form a voltage comparator layout. In particular, the inverting input terminal IN14- is connected, through a resistor R22, to the output terminal O29 of the internal generator 29 where the reference voltage Vref is generated, and across another resistor R23 connected between the output terminal O29 and ground GND.

The driver circuit 10 is completed by resistors R24 and R26, which are connected between the control terminals of the enable transistors Q3, Q9 and ground GND, respectively, and by a resistor R25 connected between these control terminals and the enable terminal TA. The operation of the driver circuit 10 according to the invention will now be described in connection with the embodiment of FIG. 10.

In normal operation, with the voltage across the resistor R15 on the output of the internal generator 29 at a greater value than the voltage across the resistor R23 on the inverting input of the voltage comparator 14, the first trigger transistor Q21 is off, and therefore, its corresponding input transistor Q17 will be held off by the first mirroring block 27 (transistor Q6). In this situation, the first trigger transistor Q20 is on, and turns on the first input transistor Q16.

A low logic voltage value is produced on the output terminal O14 of the voltage comparator 14 that is coincident with a collector terminal of the second output transistor Q19. Accordingly, transistor Q10 and the transistor Q10' of switch SW will be off, so that the transistor Q2 of the second generator GH is enabled for passing a current to the output terminal OUT of the driver circuit 10 and the IGBT transistor connected thereto.

Advantageously in this invention, as the voltage at the input terminal IN, coinciding with the substrate voltage of the sensing block 13, goes down, the base terminal of the second trigger transistor Q21 is pulled to a low value by the high voltage capacitor C1. In this situation, the voltage comparator 14 will become unbalanced, and the collector terminal of the second output transistor Q19 goes high which disables the transistor Q2 of the second generator GH.

Figure 11:
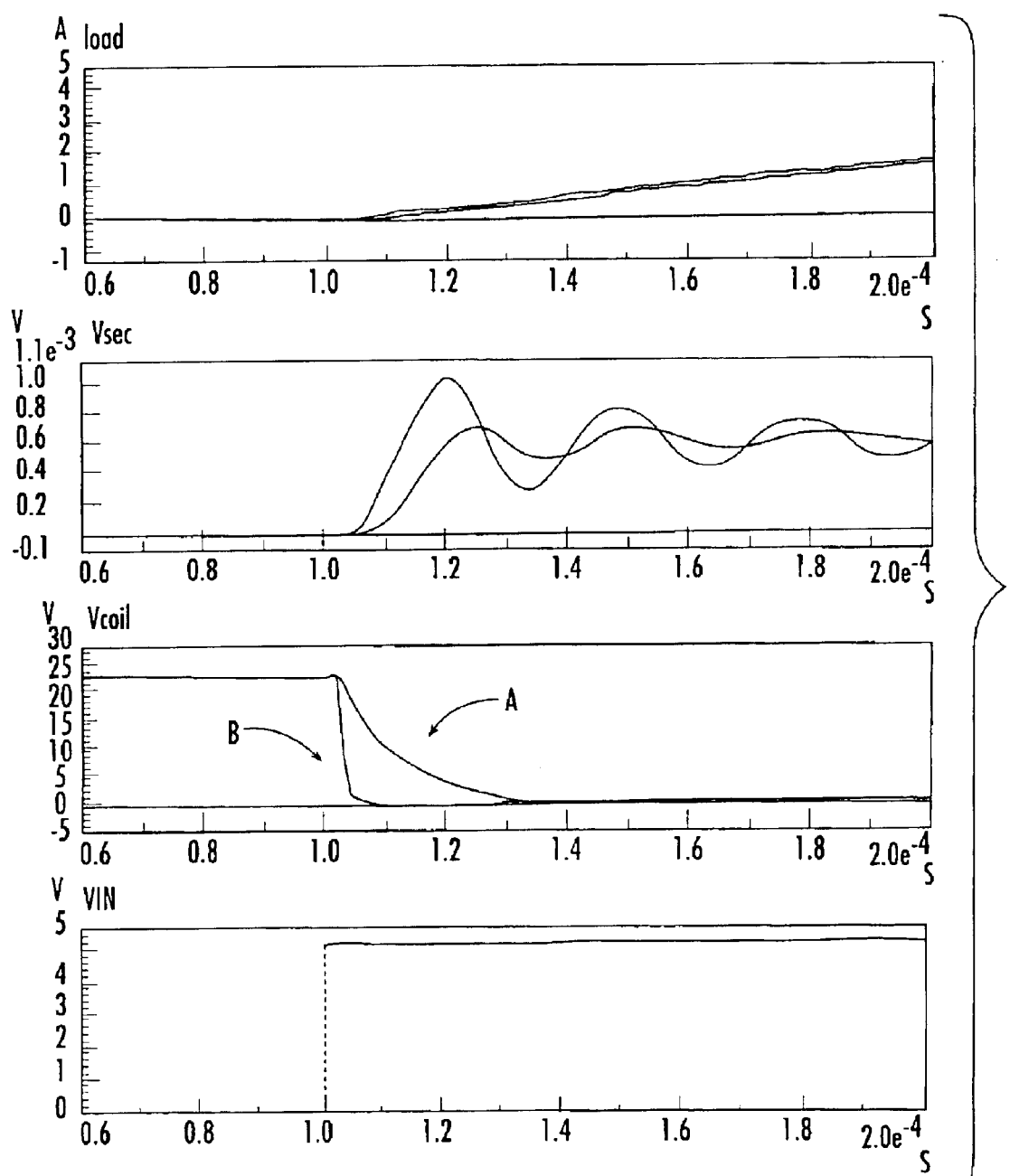
FIG. 11 shows schematically internal signals versus time of the circuit illustrated in FIG. 6.

The driver circuit 10 is held in this condition until the current peak generated by the capacitor C1 of the sensing block 13 finishes. FIG. 11 illustrates comparative voltage values at secondary windings, obtained with a driver circuit 10 according to the invention (A) and with a conventional circuit (B).

To summarize, the driver circuit 10 of this invention provides soft turn-on conditions for the power device connected to it, thus preventing any undesired overshooting. The driver provided is not bound to the variability of the power element characteristics. This driver circuit may also be used with a bipolar power transistor, which would be current driven rather than voltage driven as in this non-limitative example.

What is claimed is:

1. A driver circuit for driving a power element connected to an inductive load, the driver circuit comprising:

an input terminal connected to a conduction terminal of the power element, and an output terminal connected to a control terminal of the power element;

a first current generator connected between a voltage reference and the output terminal for providing a first charge current to the control terminal of the power element; and a second current generator connected in parallel with said first current generator between the voltage reference and the output terminal for providing a second charge current to the control terminal of the power element, the second charge current being based upon a voltage at the input terminal.

2. A driver circuit according to claim 1, further comprising:

a switch connected between said second current generator and the output terminal; and a voltage sense-and-compare circuit connected between a drive terminal of said switch and the input terminal.

3. A driver circuit according to claim 2, wherein said voltage sense-and-compare circuit comprising a sensing block, and a voltage comparator cascade connected to said sensing block.

4. A driver circuit according to claim 3, wherein said voltage comparator comprises a first input connected to an output of said sensing block, a second input connected to an internal voltage reference, and an output connected to the drive terminal of said switch.

5. A driver circuit according to 4, wherein said switch comprises a first transistor connected to the voltage reference, and said first transistor comprises a control terminal connected to the output of said voltage comparator.

6. A driver circuit according to claim 5, wherein said switch further comprises a second transistor comprising a first conduction terminal connected to the voltage reference, and a control terminal connected to a conduction terminal of said first transistor.

7. A driver circuit according to claim 6, further comprising a mirror transistor connected between a second conduction terminal of said second transistor and said second current generator.

8. A driver circuit according to claim 4, further comprising an internal generator for generating the internal voltage reference, said internal generator being connected to the voltage reference and comprising an output connected to the second input of said voltage comparator.

9. A driver circuit according to claim 1, wherein the first and second charge currents have different values.

10. driver circuit according to claim 9, wherein the first charge current is less than the second charge current.

11. A driver circuit according to claim 1, wherein said voltage sense-and-compare circuit opens said switch for disconnecting said second current generator from the output terminal when the voltage at the input terminal begins to decrease, thereby enabling the control terminal of the power element to be charged with the first charge current when the power element initiates a turn-on.

12. A driver circuit according to claim 3, wherein said sensing block differentiates the voltage at the input terminal.

13. A driver circuit according to claim 3, wherein said sensing block comprises a junction capacitor of a high-voltage integrated diode.

14. A driver circuit according to claim 1, wherein each of said first and current generators comprises:
   a resistor connected to the voltage reference; and
   a transistor comprising a first conduction terminal connected to said resistor, and a second conduction terminal connected to the output terminal;
   the driver circuit further comprising a respective enabling transistor connected to a control terminal of a corresponding transistor.

15. A driver circuit according to claim 1, wherein the power element comprises an IGBT transistor, and the conduction terminal of the power element is a collector terminal of said IGBT transistor.

16. A driver circuit for driving an IGBT transistor connected to an inductive load, the driver circuit comprising:
   an input terminal connected to a conduction terminal of the IGBT transistor, and an output terminal connected to a control terminal of the IGBT transistor;
   a first current generator connected between a voltage reference and the output terminal for providing a first charge current to the control terminal of the IGBT transistor;
   a second current generator connected in parallel with said first current generator between the voltage reference and the output terminal for providing a second charge current to the control terminal of the IGBT transistor, the second charge current being based upon a voltage at the input terminal; and
   a switch connected between said second current generator and the output terminal for disconnecting said second current generator from the output terminal so that the control terminal of the IGBT transistor is charged with the first charge current when the power element initiates a turn-on.

17. A driver circuit according to claim 16, further comprising a voltage sense-and-compare circuit connected between a drive terminal of said switch and the input terminal.

18. A driver circuit according to claim 17, wherein said voltage sense-and-compare circuit comprises a sensing block and a voltage comparator cascade connected to said sensing block.

19. A driver circuit according to claim 18, wherein said voltage comparator comprises a first input connected to an output of said sensing block, a second input connected to an internal voltage reference, and an output connected to the drive terminal of said switch.

20. A driver circuit according to claim 16, wherein the first and second charge current have different values, and the first charge current is less than the second charge current.

21. A driver circuit according to claim 16, wherein said voltage sense-and-compare circuit opens said switch for disconnecting said second current generator from the output terminal when the voltage at the input terminal begins to decrease.

22. A driver circuit according to claim 16, wherein each one of said first and current generators comprises:
   a resistor connected to the voltage reference; and
   a transistor comprising a first conduction terminal connected to said resistor, and a second conduction terminal connected to the output terminal;
   the driver circuit further comprising a respective enabling transistor connected to a control terminal of a corresponding transistor.

23. A driver circuit according to claim 19, wherein said switch comprises:
   a first transistor connected to the voltage reference, and said first transistor comprises a control terminal connected to the output of said voltage comparator; and
   a second transistor comprising a first conduction terminal connected to the voltage reference, and a control terminal connected to a conduction terminal of said first transistor.

24. An electronic ignition system comprising:
   a power element; and
   a driver circuit for driving said power element and comprising
      an input terminal connected to a conduction terminal of said power element, and an output terminal connected to a control terminal of said power element,
      a first current generator connected between a voltage reference and the output terminal for providing a first charge current to the control terminal of said power element, and
      a second current generator connected in parallel with said first current generator between the voltage reference and the output terminal for providing a second charge current to the control terminal of said power element, the second charge current being based upon a voltage at the input terminal.

25. An electronic ignition system according to claim 24, further comprising:
   a switch connected between said second current generator and the output terminal; and
   a voltage sense-and-compare circuit connected between a drive terminal of said switch and the input terminal.

26. An electronic ignition system according to claim 25, wherein said voltage sense-and-compare circuit comprises a sensing block, and a voltage comparator cascade connected to said sensing block.

27. An electronic ignition system according to claim 24, wherein the first charge current is less than the second charge current.

28. An electronic ignition system according to claim 25, wherein said voltage sense-and-compare circuit opens said switch for disconnecting said second current generator from the output terminal when the voltage at the input terminal begins to decrease, thereby enabling the control terminal of said power element to be charged with the first charge current when the power element initiates a turn-on.

29. An electronic ignition system according to claim 26, wherein each of said first and current generators comprises:
   a resistor connected to the voltage reference; and
   a transistor comprising a first conduction terminal connected to said resistor, and a second conduction terminal connected to the output terminal;

the driver circuit further comprising a respective enabling transistor connected to a control terminal of a corresponding transistor.

30. An electronic ignition system according to claim 24, wherein said switch comprises:
   a first transistor connected to the voltage reference, and said first transistor comprises a control terminal connected to an output of said voltage comparator; and
   a second transistor comprising a first conduction terminal connected to the voltage reference, and a control terminal connected to a conduction terminal of said first transistor.

31. A method for driving a power element connected to an inductive load using a driver circuit comprising an input terminal connected to a conduction terminal of the power element, and an output terminal connected to a control terminal of the power element, the method comprising:
   delivering a first charge current to the control terminal at the power element; and
   delivering a second charge current to the control terminal of the power element, the second charge current being based upon a voltage at the input terminal.

32. A method according to claim 31, wherein the first charge current is provided by a first current generator, and the second current is provided by a second current generator connected in parallel to the first current generator; the method further comprising using a switch connected between the second current generator and the output terminal for disconnecting the second current generator from the output terminal.

33. A method according to claim 32, wherein the second current generator is disconnected from the output terminal when the voltage at the input terminal begins to decrease, thereby enabling the control terminal of the power element to be charged with the first charge current when the power element initiates a turn-on.

34. A method according to claim 32, further comprising driving the switch using a voltage sense-and-compare circuit connected between a drive terminal of the switch and the input terminal.

35. A method according to claim 32, wherein each of the first and current generators comprises:
   a resistor connected to the voltage reference; and
   a transistor comprising a first conduction terminal connected to the resistor, and a second conduction terminal connected to the output terminal;
   the driver circuit further comprising a respective enabling transistor connected to a control terminal of a corresponding transistor.

36. A method according to claim 32, wherein the switch comprises:
   a first transistor connected to the voltage reference, and the first transistor comprises a control terminal connected to an output of the voltage sense-and-compare circuit; and
   a second transistor comprising a first conduction terminal connected to the voltage reference, and a control terminal connected to a conduction terminal of said first transistor.

37. A method according to wherein claim 31, wherein the power element comprises an IGBT transistor, and the conduction terminal of the power element is a collector terminal of the IGBT transistor.

* * * * *